(12) United States Patent
Min et al.

(10) Patent No.: US 10,546,829 B2
(45) Date of Patent: Jan. 28, 2020

(54) METHOD OF FABRICATING SEMICONDUCTOR PACKAGE

(71) Applicant: SAMSUNG ELECTRONICS CO., LTD., Suwon-Si, Gyeonggi-Do (KR)

(72) Inventors: Youn Ji Min, Seoul (KR); Seokhyun Lee, Hwaseong-si (KR); Jongyoun Kim, Seoul (KR); Kyoung Lim Suk, Suwon-si (KR); SeokWon Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 29 days.

(21) Appl. No.: 15/867,075

(22) Filed: Jan. 10, 2018

(65) Prior Publication Data
US 2019/0035756 A1    Jan. 31, 2019

(30) Foreign Application Priority Data
Jul. 31, 2017   (KR) .......................... 10-2017-0097251

(51) Int. Cl.
*H01L 23/538*     (2006.01)
*H01L 23/00*      (2006.01)
(Continued)

(52) U.S. Cl.
CPC .......... *H01L 24/20* (2013.01); *H01L 21/4853* (2013.01); *H01L 21/4857* (2013.01); *H01L 21/565* (2013.01); *H01L 21/568* (2013.01); *H01L 21/78* (2013.01); *H01L 23/3114* (2013.01); *H01L 23/5383* (2013.01); *H01L 23/5386* (2013.01); *H01L 23/5389* (2013.01); *H01L 23/562* (2013.01); *H01L 24/19* (2013.01);
(Continued)

(58) Field of Classification Search
CPC ......... H01L 23/53295; H01L 23/49894; H01L 23/5386; H01L 23/5389; H01L 23/3128; H01L 23/5226; H01L 21/31127; H01L 21/31138; H01L 21/31058; H01L 21/481; H01L 24/20; H01L 2224/214
See application file for complete search history.

(56) References Cited

U.S. PATENT DOCUMENTS 6,607,938 B2   8/2003   Kwon et al.
6,762,115 B2   7/2004   Lin et al.
(Continued)

*Primary Examiner* — Michael M Trinh
(74) *Attorney, Agent, or Firm* — F. Chau & Associates, LLC

(57) ABSTRACT

A method of fabricating a semiconductor package including forming a preliminary first insulating layer including a first opening, curing the preliminary first insulating layer to form a first insulating layer, forming a preliminary second insulating layer on the first insulating layer at least partially filling the first opening. The method includes forming a second opening in the preliminary second insulating layer at least partially overlapping the first opening. A sidewall of the first opening is at least partially exposed during forming the second opening. The preliminary second insulating layer is cured to form a second insulating layer. A barrier metal layer is formed along the sidewall of the first opening and along a sidewall of the second opening. A redistribution conductive pattern is formed on the barrier metal layer. A planarization process is performed to at least partially expose the second insulating layer.

20 Claims, 13 Drawing Sheets

(51) Int. Cl.
 *H01L 21/56* (2006.01)
 *H01L 21/48* (2006.01)
 *H01L 21/78* (2006.01)
 *H01L 23/31* (2006.01)
 *H01L 25/10* (2006.01)

(52) U.S. Cl.
 CPC ............ *H01L 24/96* (2013.01); *H01L 25/105* (2013.01); *H01L 2224/214* (2013.01); *H01L 2224/95001* (2013.01); *H01L 2225/1035* (2013.01); *H01L 2225/1058* (2013.01); *H01L 2924/35121* (2013.01)

(56) References Cited

U.S. PATENT DOCUMENTS

| | | | |
|---|---|---|---|
| 7,091,616 B2* | 8/2006 | Suminoe | H01L 23/3114 257/737 |
| 7,405,149 B1 | 7/2008 | Lin et al. | |
| 8,020,291 B2* | 9/2011 | En | C23G 1/10 216/35 |
| 8,803,306 B1 | 8/2014 | Yu et al. | |
| 9,496,232 B2 | 11/2016 | Yajima | |
| 9,502,365 B2* | 11/2016 | Han | H01L 23/562 |
| 9,583,462 B2 | 2/2017 | Lee et al. | |
| 2014/0252626 A1 | 9/2014 | Kang et al. | |
| 2016/0224811 A1* | 8/2016 | Kawashima | G06K 7/065 |

* cited by examiner

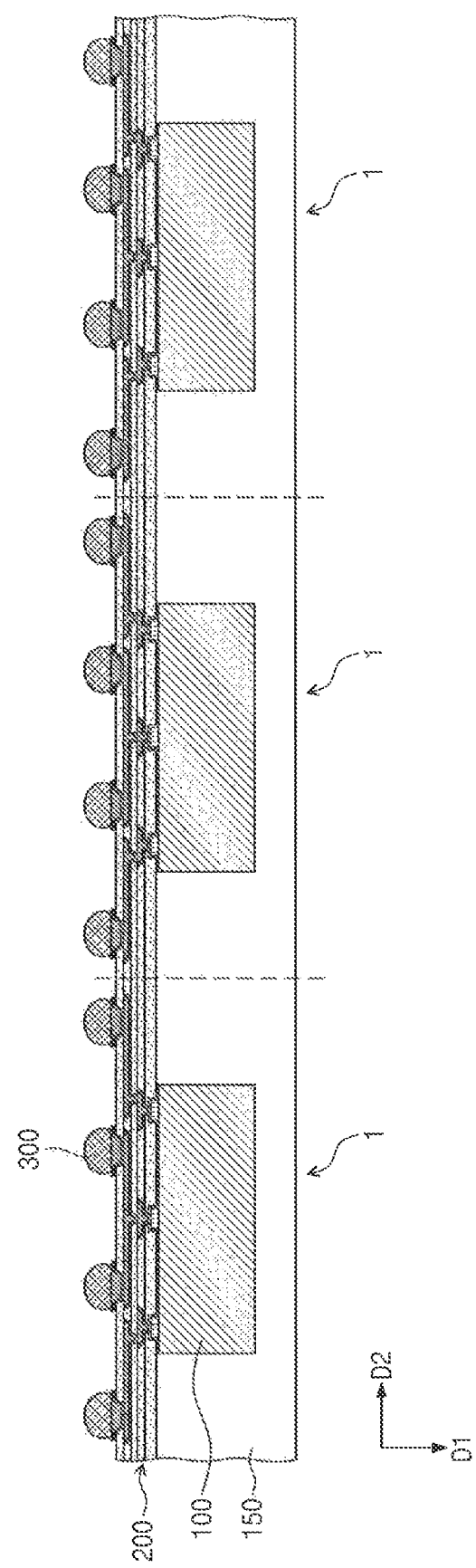

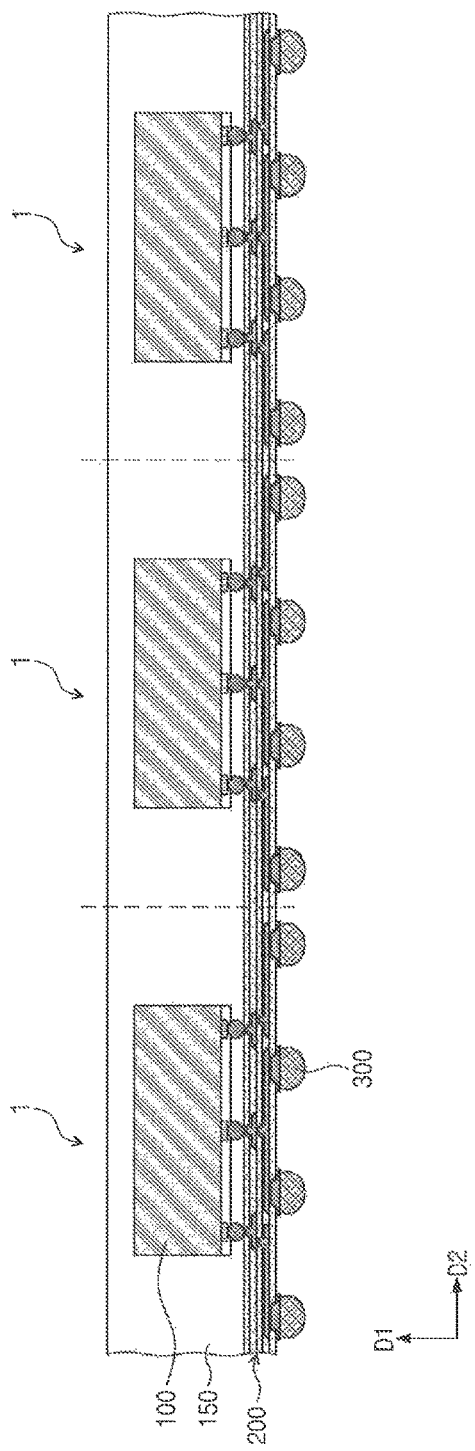

METHOD OF FABRICATING SEMICONDUCTOR PACKAGE

CROSS-REFERENCE TO RELATED APPLICATION

This U.S. non-provisional patent application claims priority under 35 U.S.C. § 119 to Korean Patent Application No. 10-2017-0097251, filed on Jul. 31, 2017 in the Korean Intellectual Property Office, the disclosure of which is incorporated by reference herein in its entirety.

TECHNICAL FIELD

Exemplary embodiments of the present inventive concept relate to a semiconductor package, and more particularly to a method of fabricating a semiconductor package.

DISCUSSION OF RELATED ART

A semiconductor package may be included in an integrated circuit chip for use in electronic products. A semiconductor package may include a semiconductor chip, a printed circuit board (PCB), and a plurality of bonding wires or bumps. The semiconductor chip may be mounted on the printed circuit board (PCB). The plurality of bonding wires or bumps may electrically connect the semiconductor chip to the printed circuit board (PCB). Electronic products may have relatively fast performance, relatively short response times, and a relatively compact size. A wafer level package and a panel level package may include the semiconductor package described above.

SUMMARY

Exemplary embodiments of the present inventive concept provide a method of fabricating a semiconductor package having an increased lifetime with a reduced failure rate.

Exemplary embodiments of the present inventive concept provide a method of fabricating a semiconductor package, which may increase an adhesive force between an insulating layer and a redistribution line.

Some exemplary embodiments of the present inventive concept provide a method of fabricating a semiconductor package. The method includes forming a preliminary first insulating layer including a first opening. The method includes curing the preliminary first insulating layer to form a first insulating layer. The method includes forming a preliminary second insulating layer on the first preliminary insulating layer at least partially filling the first opening. The method includes forming a second opening in the preliminary second insulating layer at least partially overlapping the first opening, in which a sidewall of the first opening is at least partially exposed during forming the second opening. The method includes curing the preliminary second insulating layer to form a second insulating layer. The method includes forming a barrier metal layer along the sidewall of the first opening and along a sidewall of the second opening. The method includes forming a redistribution conductive pattern on the barrier metal layer; and performing a planarization process to at least partially expose the second insulating layer.

Some exemplary embodiments of the present inventive concept provide a method of manufacturing a semiconductor package. The method includes forming on a semiconductor chip a first insulating layer including a first opening at least partially exposing the semiconductor chip. The method includes forming a second insulating layer on the first insulating layer at least partially filling the first opening. The method includes forming a second opening in the second insulating layer at least partially overlapping the first opening, in which a sidewall of the first opening is at least partially exposed during forming the second opening. The method includes sequentially forming a barrier metal layer and a redistribution conductive pattern in the first and second openings. The method includes performing a planarization process to at least partially expose the second insulating layer. The step of forming the second opening may is performed under a condition that the first insulating layer is in a cured state and the second insulating layer is in a non-cured state.

Some exemplary embodiments of the present inventive concept provide a method of manufacturing a semiconductor package. The method includes forming a redistribution substrate; and providing a semiconductor chip on the redistribution substrate electrically connecting the semiconductor chip to the redistribution substrate. The step of forming the redistribution substrate includes forming a first insulating layer on a carrier substrate including a first opening exposing at least a portion of the carrier substrate. The step of forming the redistribution substrate includes forming a second insulating layer on the first insulating layer filling at least a portion of the first opening. The step of forming the redistribution substrate includes forming a second opening in the second insulating layer, in which a sidewall of the first opening is at least partially exposed during forming the second opening. The step of forming the redistribution substrate includes sequentially forming a barrier metal layer and a redistribution conductive pattern in the first and second openings. The step of forming the redistribution substrate includes performing a planarization process to at least partially expose the second insulating layer. The step of forming the second opening is performed under a condition that the first insulating layer is in a cured state and the second insulating layer is in a non-cured state.

BRIEF DESCRIPTION OF THE DRAWINGS

The above and other features of the present inventive concept will become more apparent by describing in detail exemplary embodiments thereof, with reference to the accompanying drawings, in which:

FIGS. 4A, 4B, 4C, 4D, 4E, 4F, 4G, 4H, 4I, 4J, 4K and 4L are cross-sectional views illustrating a method of fabricating a semiconductor package according to an exemplary embodiment of the present inventive concept; and FIGS. 5A, 5B, 5C, 5D, 5E, 5F, 5G, 5H and 5I are cross-sectional views illustrating a method of manufacturing a semiconductor package according to an exemplary embodiment of the present inventive concept.

DETAILED DESCRIPTION OF THE EMBODIMENTS

Exemplary embodiments of the present inventive concept will be discussed in more detail below with reference to the accompanying drawings.

Figure 1:
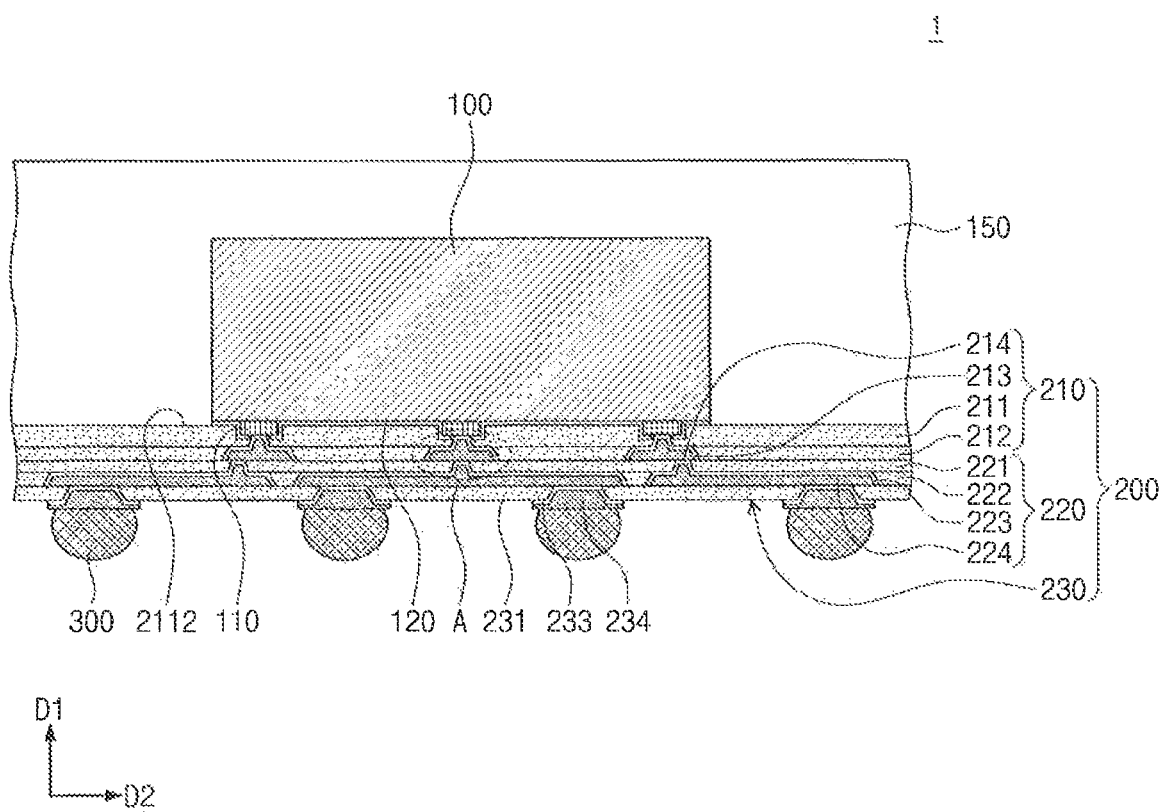
FIG. 1 is a cross-sectional view illustrating a semiconductor package according to an exemplary embodiment of the present inventive concept.
Figure 2A:
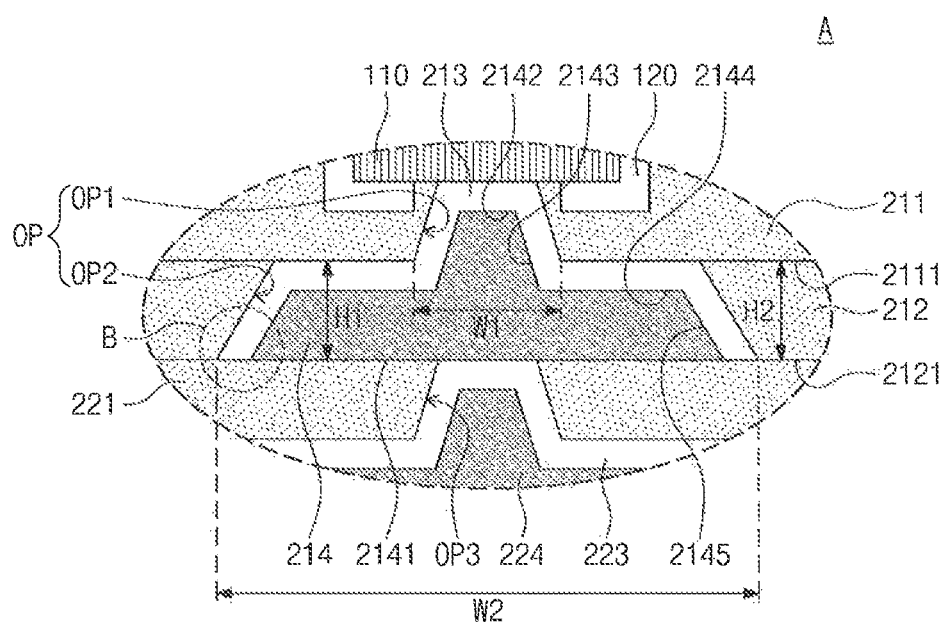
FIG. 2A is an enlarged view of Section A of FIG. 1 according to an exemplary embodiment of the present inventive concept.
Figure 2B:
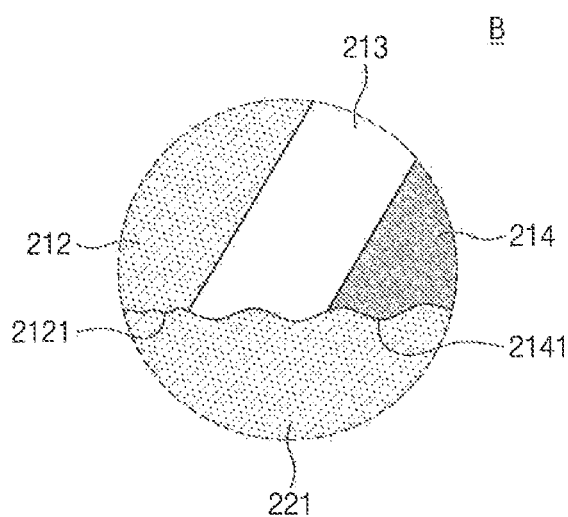
FIG. 2B is an enlarged view of Section B of FIG. 2A according to an exemplary embodiment of the present inventive concept.

FIG. 1 is a cross-sectional view illustrating a semiconductor package according to an exemplary embodiment of the present inventive concept. FIG. 2A is an enlarged view illustrating Section A of FIG. 1 according to an exemplary embodiment of the present inventive concept. FIG. 2B is an enlarged view illustrating Section B of FIG. 2A according to an exemplary embodiment of the present inventive concept.

Referring to FIGS. 1, 2A, and 2B, a semiconductor package 1 according to an exemplary embodiment of the present inventive concept may include a semiconductor chip 100, a molding layer 150, a redistribution substrate 200, and an external terminal 300.

The semiconductor chip 100 may be disposed on a top surface 2112 of the redistribution substrate 200. The top surface 2112 of the redistribution substrate 200 may face the semiconductor chip 100. The semiconductor chip 100 may include chip pads 110 and a passivation layer 120. The chip pads 110 and the passivation layer 120 may be disposed on a bottom surface of the semiconductor chip 100. The bottom surface of the semiconductor chip 100 may face the redistribution substrate 200. The passivation layer 120 may at least partially cover each of the chip pads 110 and the bottom surface of the semiconductor chip 100. The passivation layer 120 may include holes. The holes may at least partially expose the chip pads 110. The semiconductor chip 100 may include silicon (Si).

The molding layer 150 may be disposed on the top surface 2112 of the redistribution substrate 200. The molding layer 150 may cover (e.g., at least partially cover) the semiconductor chip 100. For example, the molding layer 150 may at least partially cover top and side surfaces of the semiconductor chip 100. The top surface of the semiconductor chip 100 may be spaced apart in a first direction D1 from the bottom surface of the semiconductor chip 100. The molding layer 150 may include, for example, an epoxy polymer. The first direction D1 may be parallel to a vertical direction (e.g., an "up-and-down" direction in a cross-sectional view).

The redistribution substrate 200 may be disposed on the bottom surface of the semiconductor chip 100. The redistribution substrate 200 may be disposed on a bottom surface of the molding layer 150. The bottom surface of the molding layer 150 may face the redistribution substrate 200. The redistribution substrate 200 may have a thickness less than a thickness of the semiconductor chip 100. The redistribution substrate 200 may include at least one insulation section. In some exemplary embodiments of the present inventive concept, the redistribution substrate 200 may include a first insulation section 210 and a second insulation section 220. The first insulation section 210 may be disposed on the second insulation section 220. The redistribution substrate 200 may further include a third insulation section 230. The second insulation section 220 may be disposed between the first insulation section 210 and the third insulation section 230.

The first insulation section 210 may include a first insulating layer 211, a second insulating layer 212, a first redistribution conductive pattern 214, and a first barrier metal layer 213. The second insulation section 220 may include a third insulating layer 221, a fourth insulating layer 222, a second redistribution conductive pattern 224, and a second barrier metal layer 223.

The first insulating layer 211 may be disposed on the second insulating layer 212. The first and second insulating layers 211 and 212 may each include a curable material. The first and second insulating layers 211 and 212 may be cured, for example, by heat or light. The curable material may include a polyamide-based polymer and/or an inorganic material such as silicon oxide, silicon nitride, or silicon oxynitride; however, exemplary embodiments of the present inventive concept are not limited thereto. For example, the curable material may include one or more of photosensitive polyimide (PSPI), polybenzoxazole (PBO), phenolic polymer, benzocyclobutene (BCB) polymer, or epoxy polymer. In some exemplary embodiments of the present inventive concept, the first and second insulating layers 211 and 212 may each include a same curable material as each other; however, exemplary embodiments of the present inventive concept are not limited thereto. For example, the first and second insulating layers 211 and 212 may include different curable materials from each other.

The first insulating layer 211 may be disposed on the bottom surface of the semiconductor chip 100. For example, the first insulating layer 211 may at least partially cover each of a bottom surface of the chip pad 110, the bottom surface of the molding layer 150, and a bottom surface of the passivation layer 120. The first insulating layer 211 may include the top surface 2112 and a bottom surface 2111. The top surface 2112 and the bottom surface 2111 of the first insulating layer 211 may face each other. In some exemplary embodiments of the present inventive concept, the top surface 2112 of the first insulating layer 211 may be a top surface of the redistribution substrate 200.

Figure 4A:
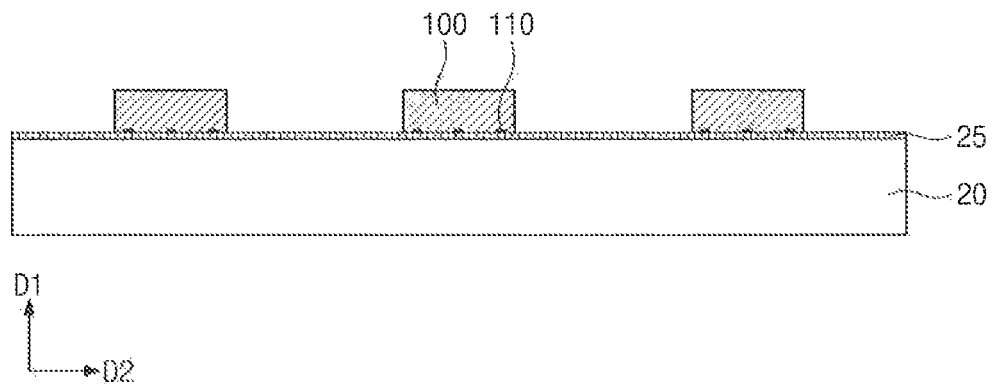
Figure 4B:
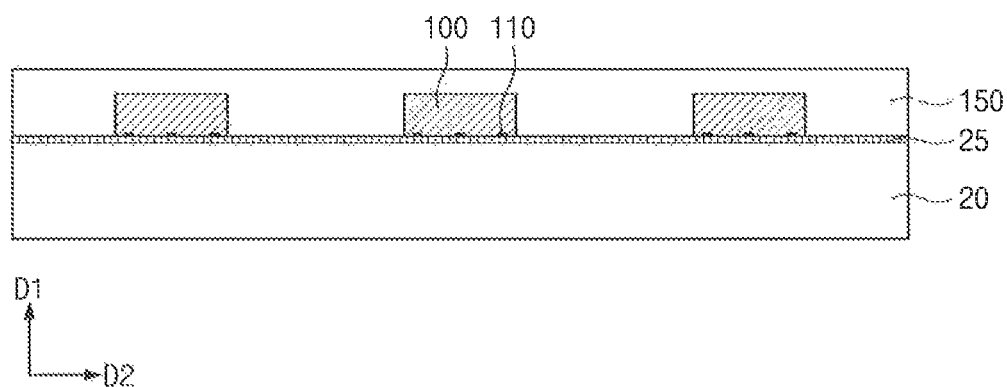
Figure 4C:
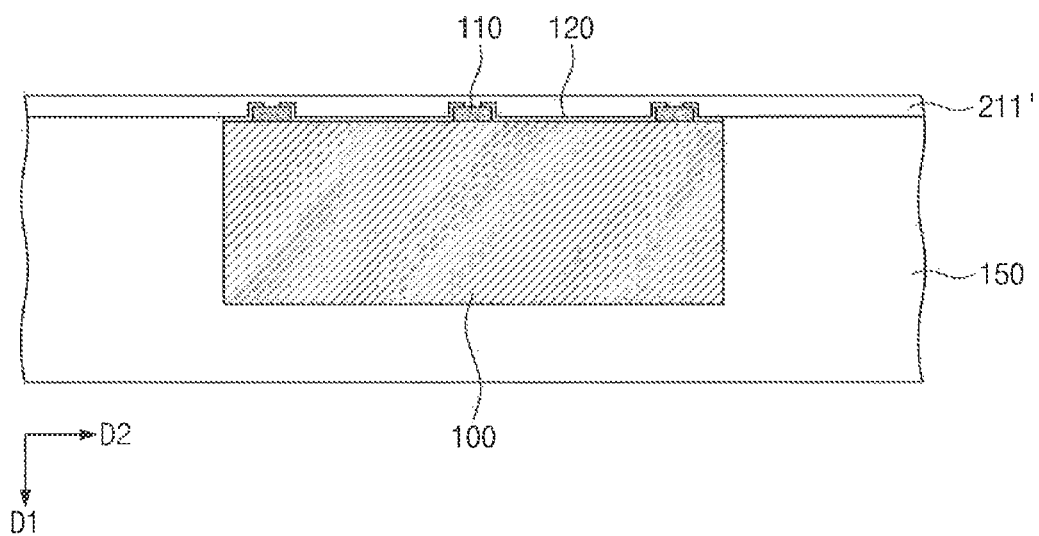
Figure 4D:
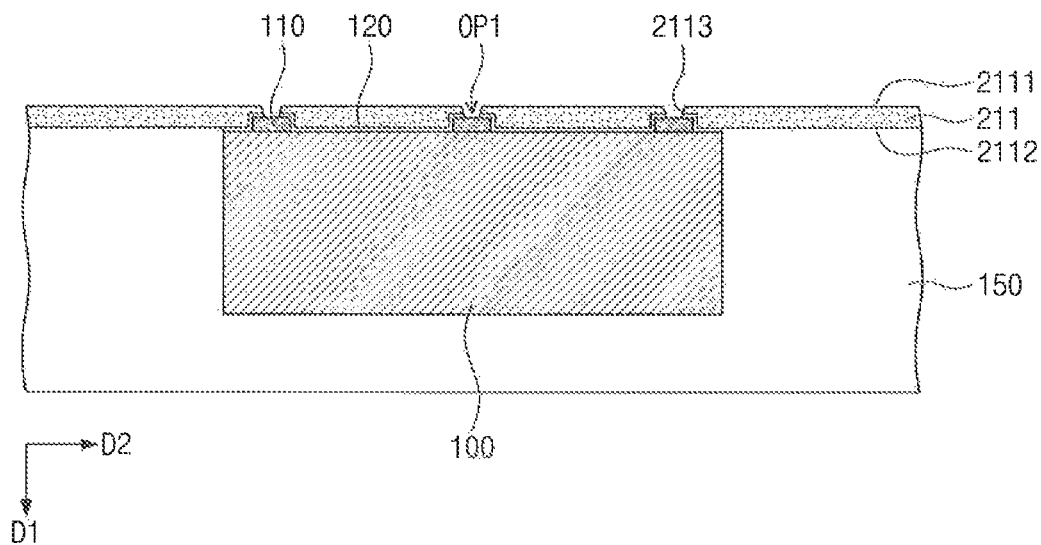

Referring to FIGS. 2A and 4D (described in more detail below), the first insulating layer 211 may include a first opening OP1. The first opening OP1 may penetrate the first insulating layer 211. The first opening OP1 may at least partially expose the chip pad 110. The first opening OP1 may also at least partially expose a first sidewall 2113 of the first insulating layer 211. The first insulating layer 211 may include a plurality of first openings OP1.

The second insulating layer 212 may be disposed on the bottom surface 2111 of the first insulating layer 211. The first insulating layer 211 may be positioned between the semiconductor chip 100 and the second insulating layer 212. In some exemplary embodiments of the present inventive concept, the second insulating layer 212 may have a bottom surface 2121. The bottom surface 2121 of the second insulating layer 212 may be in direct contact with a top surface of the third insulating layer 221.

The second insulating layer 212 may include a second opening OP2. The second opening OP2 may penetrate the second insulating layer 212. Referring to FIG. 4F (described in more detail below), the second opening OP2 may expose at least a portion of the bottom surface 2111 of the first insulating layer 211. The second opening OP2 may expose at least a portion of a second sidewall 2123 of the second insulating layer 212. At least a portion of the second opening OP2 may vertically overlap with the first opening OP1. The second opening OP2 may have a width W2 greater than a width W1 of the first opening OP1. For example, when viewed in plan, the first opening OP1 may be positioned in the second opening OP2. The second insulating layer 212 may include a plurality of second openings OP2. In some exemplary embodiments of the present inventive concept, the term "width" may refer to a length in a second direction D2, The second direction D2 may be perpendicular to the first direction D1 (e.g., "a side-to-side" direction in a cross-sectional view).

The first and second openings OP1 and OP2 may form a single opening OP. The first and second openings OP1 and OP2 may be formed at substantially a same time. For example, a dual damascene process may be performed to simultaneously form the first and second openings OP1 and OP2 respectively in the first and second insulating layers 211 and 212. The process thereof will be discussed in more detail below.

The first barrier metal layer 213 may be provided between the first insulating layer 211 and the first redistribution conductive pattern 214. The first barrier metal layer 213 may be provided between the second insulating layer 212 and the first redistribution conductive pattern 214. For example, the first barrier metal layer 213 may be formed between the first redistribution conductive pattern 214 and the first sidewall 2113 of the first insulating layer 211. The first barrier metal layer 213 may also be formed between the first redistribution conductive pattern 214 and the second sidewall 2123 of the second insulating layer 212.

The first bather metal layer 213 may be provided on a region at least partially exposed to the first and second openings OP1 and OP2. For example, the first barrier metal layer 213 may be provided on the first and second sidewalls 2113 and 2123 of the first insulating layer 211 and the second insulating layer 212, respectively. The first barrier metal layer 213 may be provided on a lower portion of the first opening OP1. For example, the first barrier metal layer 213 may be provided on the chip pad 110, at least partially exposed by the first opening OP1, of the semiconductor chip 100. The first barrier metal layer 213 may be provided on the bottom surface 2111 at least partially exposed to the second opening OP2.

The first barrier metal layer 213 may include a metallic material. In some exemplary embodiments of the present inventive concept, the first barrier metal layer 213 may be formed, for example, by depositing a metallic material on the region at least partially exposed to the first and second openings OP1 and OP2 and on the bottom surface 2121 of the second insulating layer 212. For example, the first barrier metal layer 213 may include at least one of Ta, TaN, TaSiN, Ti, TiN, TiSiN, W, or WN. The first barrier metal layer 213 may have a thickness in a range of from about 5 Å to about 50 Å.

The first redistribution conductive pattern 214 may be provided on the first barrier metal layer 213. The first redistribution conductive pattern 214 may include a conductive material. For example, the first redistribution conductive pattern 214 may include copper (Cu), aluminum (Al), or a copper alloy. The copper alloy may refer to copper (Cu) mixed with a relatively small amount of C, Ag, Co, Ta, In, Sn, Zn, Mn, Ti, Mg, Cr, Ge, Sr, Pt, Mg, Al, or Zr. The first redistribution conductive pattern 214 may be provided in the first and second insulating layers 211 and 212. The first redistribution conductive pattern 214 may be electrically connected to the chip pad 110 and/or to the second redistribution conductive pattern 224.

The first redistribution conductive pattern 214 may include a top surface 2142 and a bottom surface 2141. The top surface 2142 and the bottom surface 2141 of the first redistribution conductive pattern 214 may face each other. The bottom surface 2141 of the first redistribution conductive pattern 214 may have a width greater than a width of the top surface 2142 of the first redistribution conductive pattern 214. The bottom surface 2141 of the first redistribution conductive pattern 214 may partially vertically overlap the top surface 2142 of the first redistribution conductive pattern 214.

The bottom surface 2141 of the first redistribution conductive pattern 214 may be positioned at substantially the same level as the bottom surface 2121 of the second insulating layer 212. The bottom surface 2141 of the first redistribution conductive pattern 214 may be substantially coplanar with the bottom surface 2121 of the second insulating layer 212. For example, the bottom surface 2141 of the first redistribution conductive pattern 214 and the bottom surface 2121 of the second insulating layer 212 may be positioned on substantially the same plane. In such a configuration, a vertical distance H2 between the lower surface 2121 of the second insulating layer 2121 and the lower surface 2111 of the first insulating layer 2111 may be substantially the same as a vertical distance H1 between the lower surface 2141 of the first redistribution conductive pattern 214 and the lower surface 2111 of the first insulating layer 211.

Referring to HG 2B, the bottom surface 2141 of the first redistribution conductive pattern 214 may have a surface roughness greater than a surface roughness of the bottom surface 2121 of the second insulating layer 212, such as, for example, a surface roughness of greater amplitude and period as illustrated. The bottom surface 2141 of the first redistribution conductive pattern 214 may have a surface roughness including protrusions extending in a range of from about 0.01 μm to 0.5 μm. The bottom surface 2141 of the first redistribution conductive pattern 214 may have a surface roughness including protrusions extending in a range of from about 0.01 μm to about 0.086 μm. The bottom surface 2121 of the second insulating layer 212 may have a surface roughness including protrusions extending in a range of from about 0.01 μm to about 0.5 μm. The bottom surface 2121 of the second insulating layer 212 may have a surface roughness including protrusions extending in a range of from about 0.01 μm to about 0.086 μm. Accordingly, an adhesive force may be greater between the bottom surface 2141 of the first redistribution conductive pattern 214 and the third insulating layer 221 than between the bottom surface 2121 of the second insulating layer 212 and the third insulating layer 221. Thus, an increased heterojunction may be provided between the first redistribution conductive pattern 214 and the third insulating layer 221. The term "heterojunction" may refer to a junction between components having different materials from each other.

The first redistribution conductive pattern 214 may include a stepped surface 2144. The stepped surface 2144 may be disposed between the top surface 2142 and the bottom surface 2141. The first redistribution conductive pattern 214 may include a first side surface 2143 and a second side surface 2145. The first side surface 2143 may connect the top and stepped surfaces 2142 and 2144 to each other. The second side surface 2145 may connect the bottom and stepped surfaces 2141 and 2144 to each other. The top, bottom, and stepped surfaces 2142, 2141, and 2144 of the first redistribution conductive pattern 214 may be substantially parallel to each other.

The second side surface 2145 may have a width greater than a width of the first side surface 2143. The widths of the first and second side surfaces 2143 and 2145 may gradually increase from the top surface 2142 to the bottom surface 2141 of the first redistribution conductive pattern 214. In some exemplary embodiments of the present inventive concept, the first and second side surfaces 2143 and 2145 may be inclined with respect to the stepped surface 2144. In some exemplary embodiments of the present inventive concept, the first and second side surfaces 2143 and 2145 may be substantially perpendicular to the stepped surface 2144. The first and second side surfaces 2143 and 2145 may be substantially parallel to each other; however, exemplary embodiments of the present inventive concept are not limited thereto.

The first and second insulating layers 211 and 212 may have a thermal expansion coefficient. The thermal expansion coefficient of the first and second insulating layers 211 and 212 may be different from a thermal expansion coefficient of the first redistribution conductive pattern 214. Thus, a thermal stress may be produced between the first redistribution conductive pattern 214 and the first and second insulating layers 211 and 212. When the first barrier metal layer 213 is not provided between an insulating layer and the first side wall 2143 of the first redistribution conductive pattern 214 and/or between an insulating layer and the second side wall 2145 of the first redistribution conductive pattern 214, the thermal stress may form an oxidation layer on the first side surface 2143 and/or the second side surface 2145 of the first redistribution conductive pattern 214. The oxidation layer may decrease an adhesive force between the insulating layer and the first side surface 2143 of the first redistribution conductive pattern 214 and/or between the insulating layer and the second side surface 2145 of the first redistribution conductive pattern 214. Accordingly, the first side surface 2143 and/or the second side surface 2145 of the first redistribution conductive pattern 214 may at least partially peel off the insulating layer. Thus, a semiconductor package may have a reduced lifetime or may be damaged.

According to some exemplary embodiments of the present inventive concept, the semiconductor package 1 may include the first barrier metal layer 213 between the first insulating layer 211 and the first side surface 2143 of the first redistribution conductive pattern 214. The semiconductor package 1 may include the first barrier metal layer 213 between the second insulating layer 212 and the second side surface 2145 of the first redistribution conductive pattern 214. The first barrier metal layer 213 may reduce or prevent the first and second side surfaces 2143 and 2145 of the first redistribution conductive pattern 214 from peeling, for example, as a result of thermal stress. Thus, the semiconductor package 1 may have an increased lifetime and may less likely to suffer from damages.

The second insulation section 220 may include the third insulating layer 221, the fourth insulating layer 222, the second redistribution conductive pattern 224, and the second barrier metal layer 223. The second insulation section 220 may have substantially the same configuration as the first insulation section 210 described above. Thus, a discussion of the second insulation section 220 below may focus on differences between the second insulation section 220 and the first insulation section 210.

The third insulating layer 221 may be provided on the bottom surface 2121 of the second insulating layer 212. The third insulating layer 221 may include a third opening OP3. The third opening OP3 may penetrate the third insulating layer 221. The third insulating layer 221 may include a plurality of third openings OP3. The third opening OP3 may at least partially expose the first redistribution conductive pattern 214. For example, the third opening OP3 may partially expose the bottom surface 2141 of the first redistribution conductive pattern 214. The third insulating layer 221 may have substantially the same configuration as that of the first insulating layer 211.

The second redistribution conductive pattern 224 may be positioned between the third and fourth insulating layers 221 and 222. The second redistribution conductive pattern 224 may be electrically coupled to the first redistribution conductive pattern 214. The phrase "coupled to" may include "directly coupled to" or "indirectly coupled through other component(s) to."

The third insulation section 230 may include a fifth insulating layer 231, a third barrier metal layer 233, and a third redistribution conductive pattern 234. The third insulation section 230 may include a single insulating layer. The third redistribution conductive pattern 234 may be disposed on the third barrier metal layer 233.

The third barrier metal layer 233 may be positioned between the fifth insulating layer 231 and the third redistribution conductive pattern 234. The third redistribution conductive pattern 234 may have a structure protruding from the fifth insulating layer 231. For example, the third barrier metal layer 233 might not be formed on a portion of a side surface of the third redistribution conductive pattern 234. The third redistribution conductive pattern 234 may be electrically connected to the second redistribution conductive pattern 224, for example, through the third barrier metal layer 233.

A plurality of the external terminals 300 may be provided on a bottom surface of the redistribution substrate 200. For example, the external terminals 300 may be provided on a plurality of the third redistribution conductive patterns 234. Accordingly, the redistribution substrate 200 may be positioned between the external terminals 300 and the semiconductor chip 100. The external terminals 300 may be electrically connected to the third redistribution conductive patterns 234. Thus, the external terminals 300 may be electrically coupled to the semiconductor chip 100, for example, through each of the first, second, and third redistribution conductive patterns 214, 224, and 234.

Each of the external terminals 300 may have a solder ball shape; however, exemplary embodiments of the present invention are not limited thereto. One or more of the external terminals 300 may at least partially vertically overlap the semiconductor chip 100. Other ones of the external terminals 300 might not vertically overlap the semiconductor chip 100. One or more of the external terminals 300 may at least partially overlap the molding layer 150 in a plan view. In some exemplary embodiments of the present inventive concept, the semiconductor package 1 may be a fan-out panel semiconductor package; however, exemplary embodiments of the present inventive concept are not limited thereto.

Figure 3:
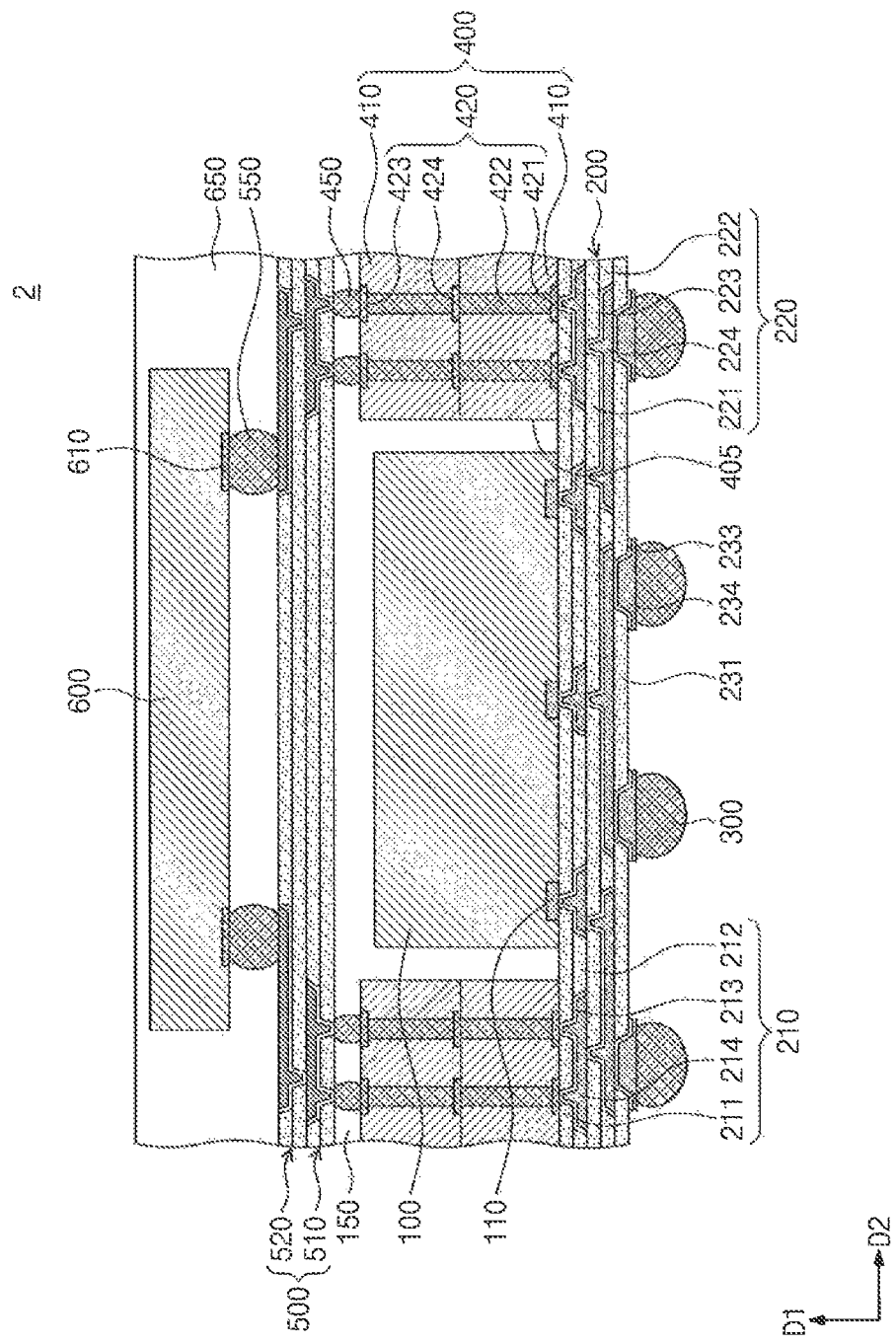
FIG. 3 is a cross-sectional view illustrating a semiconductor package according to an exemplary embodiment of the present inventive concept.

FIG. 3 is a cross-sectional view illustrating a semiconductor package according to an exemplary embodiment of the present inventive concept. Descriptions of components substantially the same as those of the exemplary embodiments of the present inventive concept discussed above with reference to FIGS. 1, 2A, and 2B may be omitted below.

Referring to FIG. 3, a semiconductor package 2 may include the first semiconductor chip 100, a second semiconductor chip 600, the first molding layer 150, a second molding layer 650, a connection substrate 400, the first redistribution substrate 200, and a second redistribution substrate 500. The semiconductor package 2 may further include first external terminals 300, second external terminals 550, and connection terminals 450.

The first semiconductor chip 100 may be disposed on a top surface of the first redistribution substrate 200. The semiconductor package 2 may include one or more first chip pads 110 and a first passivation layer. The one or more first chip pads 110 and the first passivation layer may be provided on a bottom surface of the first semiconductor chip 100.

The connection substrate 400 may be disposed on the top surface of the first redistribution substrate 200. The connection substrate 400 may be positioned between the first and second redistribution substrates 200 and 500. The connection substrate 400 may at least partially surround a side surface of the first semiconductor chip 100 in a plan view. The connection substrate 400 may include an insertion opening 405. The insertion opening 405 may penetrate the connection substrate 400. The first semiconductor chip 100 may be at least partially disposed in the insertion opening 405. The insertion opening 405 may have a size greater than a size of the first semiconductor chip 100. Thus, a gap may be produced between the connection substrate 400 and the first semiconductor chip 100.

The connection substrate 400 may include base layers 410 and a conductive connection member 420. In some exemplary embodiments of the present inventive concept, a printed circuit board (PCB) may be used as the connection substrate 400. The base layers 410 may include a non-conductive material. For example, the base layers 410 may include a carbon-containing material (e.g., graphite or grapheme), a ceramic, or a polymer (e.g., polycarbonate, nylon, or high-density polyethylene (HDPE)).

The conductive connection member 420 may include first connection pads 421, line patterns 424, second connection pads 423, and vias 422. The first connection pads 421 may be formed on the first redistribution substrate 200. The first connection pads 421 may be electrically connected to the first redistribution conductive patterns 214. The second connection pads 423 may be provided on a top surface of the connection substrate 400. The vias 422 may at least partially penetrate the base layers 410. The line patterns 424 may be positioned between each of the base layers 410. The line patterns 424 may be coupled to the vias 422. The line patterns 424 may be positioned between the first and second connection pads 421 and 423. The line patterns 424 may be electrically connected to the first and second connection pads 421 and 423, for example, through the vias 422. The conductive connection member 420 may include copper, nickel, aluminum, gold, silver, stainless steel, or an alloy thereof. The first connection pads 421, the second connection pads 423, the vias 422, and the line patterns 424 may at least partially vertically overlap each other.

The first redistribution substrate 200 may include at least one insulation section. In some exemplary embodiments of the present inventive concept, the first redistribution substrate 200 may include a first insulation section 210, a second insulation section 220, a third insulation section 230. The first insulation section 210 may include a first insulating layer 211, a second insulating layer 212, a first barrier metal layer 213, and a first redistribution conductive pattern 214. The second insulation section 220 may include a third insulating layer 221, a fourth insulating layer 222, a second barrier metal layer 223, and a second redistribution conductive pattern 224. The third insulation section 230 may include a fifth insulating layer 231, a third barrier metal layer 233, and a third redistribution conductive pattern 234. A plurality of the first redistribution conductive patterns 214 may each be coupled to the first chip pads 110 and the first connection pads 421.

The first external terminals 300 may be provided on a bottom surface of the first redistribution substrate 200. In some exemplary embodiments of the present inventive concept, the first external terminals 300 may be electrically connected to a plurality of the third redistribution conductive patterns 234. Thus, the first external terminals 300 may be electrically connected to the first chip pads 110 and the first connection pads 421.

The first molding layer 150 may be formed on the connection substrate 400 and the first semiconductor chip 100. The first molding layer 150 may be provided in the gap between the connection substrate 400 and the first semiconductor chip 100. The first molding layer 150 may include a plurality of openings. The plurality of openings in the first molding layer 150 may at least partially expose the second connection pads 423.

The connection terminals 450 may be formed on the plurality openings of the first molding layer 150. Thus, the connection terminals 450 may be electrically coupled to the second connection pads 423, for example, through the plurality of openings of the first molding layer 150.

The second redistribution substrate 500 may be formed on a top surface of the first molding layer 150. The second redistribution substrate 500 may include at least one insulation section. In some exemplary embodiments of the present inventive concept, the second redistribution substrate 500 may include a fourth insulation section 510 and a fifth insulation section 520. The fourth and fifth insulation sections 510 and 520 may be formed to have substantially the same structure as a structure of the first and second insulation sections 210 and 220. The fourth insulation section 510 may include redistribution conductive patterns. The redistribution conductive patterns of the fourth insulation section 510 may be coupled to the connection terminals 450. The fifth insulation section 520 may include redistribution conductive patterns. The redistribution patterns of the fifth insulation section 520 may be electrically coupled to each of the redistribution conductive patterns of the fourth insulation section 510 and to the second external terminals 550.

The second semiconductor chip 600 may be provided over the second redistribution substrate 500. Second chip pads 610 may be provided on a bottom surface of the second semiconductor chip 600.

The second external terminals 550 may be positioned between the second semiconductor chip 600 and the second redistribution substrate 500. The second external terminals 550 may be electrically connected to each of the redistribution conductive patterns of the fifth insulation section 520 and to the second chip pads 610.

The second molding layer 650 may at least partially cover the second semiconductor chip 600 and the second redistribution substrate 500. The second molding layer 650 may include substantially a same material as a material of the first molding layer 150; however, exemplary embodiments of the present invention are not limited thereto.

FIGS. 4A, 4B, 4C, 4D, 4E, 4F, 4G, 4H, 4I, 4J, 4K and 4L are cross-sectional views illustrating a method of fabricating a semiconductor package according to an exemplary embodiment of the present inventive concept.

Referring to FIG. 4A, a support substrate 20 may be provided. An adhesive layer 25 may be disposed on, for example, an upper surface of the support substrate 20. A plurality of semiconductor chips 100 may be disposed on the support substrate 20. The semiconductor chips 100 may be arranged along the second direction D2. The semiconductor chips 100 may be spaced apart from each other, for example, in the second direction D2. The adhesive layer 25 may adhere the semiconductor chip 100 to the support substrate 20. The semiconductor chips 100 may each include chip pads 110 and a passivation layer 120 (see, e.g., FIGS. 1 and 4C). The chip pads 110 and the passivation layer may face the support substrate 20.

Referring to FIG. 4B, the molding layer 150 may be formed on the support substrate 20. The molding layer 150 may at least partially cover the semiconductor chips 100. For example, an insulating material may be provided on the support substrate 20. The insulating material may at least partially cover the semiconductor chips 100. Accordingly, the molding layer 150 may be provided on each of the support substrate 20 and the semiconductor chips 100.

One of the semiconductor chips 100 is discussed in more detail below regarding a method of fabricating a semiconductor package with reference to FIGS. 4C to 4K. Referring to FIG. 4C, the support substrate 20 may be at least partially removed from each of the semiconductor chip 100 and the molding layer 150. The removal of the support substrate 20 may expose a bottom surface of the semiconductor chip 100 and a bottom surface of the molding layer 150. The semiconductor chip 100 and the molding layer 150 may be turned upside down, e.g., about 180 degrees.

After the semiconductor chip 100 and the molding layer 150 are turned upside down, a preliminary first insulating layer 211' may be formed on the bottom surfaces of each of the semiconductor chip 100 and the molding layer 150. The preliminary first insulating layer 211' may be in a non-cured state. For example, the non-cured preliminary first insulating layer 211' may at least partially cover each of the chip pads 110, the passivation layer 120, and the bottom surface of the molding layer 150. The preliminary first insulating layer 211' may be formed, for example, using PECVD (Plasma Enhanced CVD), HDPCVD (High Density Plasma CVD), APCVD (Atmospheric Pressure CVD), or spin coating.

Referring to FIG. 4D, the preliminary first insulating layer 211' (see, e.g., FIG. 4C) may be provided. The preliminary first insulating layer 211' may include first openings OP1, The first openings OP1 of the first insulating layer 211' may at least partially expose the semiconductor chip 100, for example, the chip pads 110 of the semiconductor chip 100. As an example, the first openings OP1 at least partially exposing the chip pads 110 may be formed in the preliminary first insulating layer 211'. Accordingly, the preliminary first insulating layer 211' including the first openings OP1 may be formed on the lower surface of the semiconductor chip 100.

In some exemplary embodiments of the present inventive concept, the first openings OP1 may be formed, for example, by forming a first mask pattern on the preliminary first insulating layer 211'. The first mask pattern may be used as an etch mask to etch the preliminary first insulating layer 211'. The first openings OP1 may at least partially expose each of a first sidewall 2113 of the preliminary first insulating layer 211' and the chip pads 110 of the semiconductor chip 100.

The preliminary first insulating layer 211' may be cured prior to forming the second openings OP2, which will be discussed in more detail below. In some exemplary embodiments of the present inventive concept, after the first openings OP1 are formed in the preliminary first insulating layer 211', the preliminary first insulating layer 211' may be thermally or optically cured to form a first insulating layer 211. For example, the preliminary first insulating layer 211' may be provided in a chamber. The chamber may have a temperature in a range of from about 150° C. to about 200° C. The preliminary first insulating layer 211' may be cooled to room temperature (e.g., about 25° C.) to obtain the first insulating layer 211, which is cured.

Figure 4E:
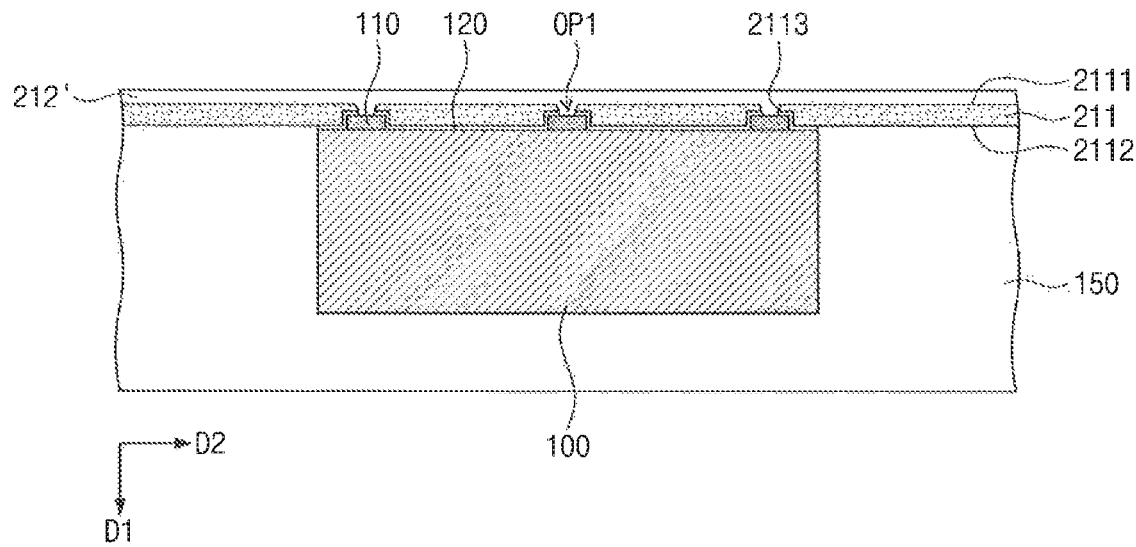
Figure 4F:
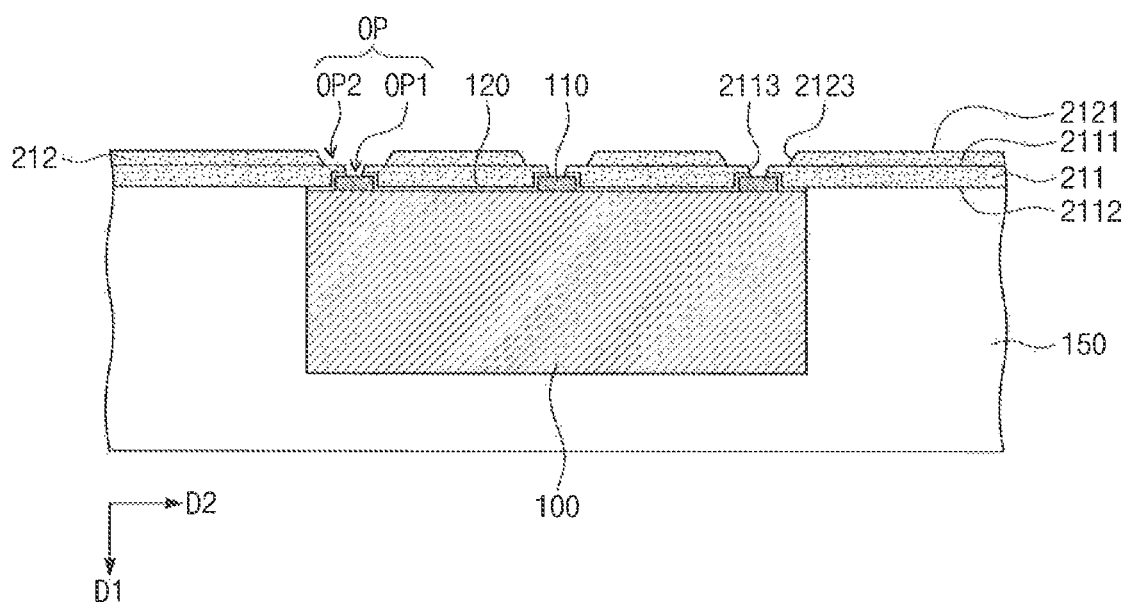

Referring to FIG. 4E, a preliminary second insulating layer 212' may be formed on a bottom surface 2111 of the first insulating layer 211. Thus, the first openings OP1 may be at least partially filled by the preliminary second insulating layer 212'. The preliminary second insulating layer 212' may be in a non-cured state. For example, the preliminary second insulating layer 212' may at least partially cover the bottom surface 2111 of the first insulating layer 211 and at least partially fill the first openings OP1. The preliminary second insulating layer 212' may be formed, for example, by using PECVD (Plasma Enhanced CVD), HDPCVD (High Density Plasma CVD), APCVD (Atmospheric Pressure CVD), or spin coating.

Referring to 4F, the preliminary second insulating layer 212' may be provided. The preliminary second insulating layer 212' may include second openings OP2. The second openings OP2 may at least partially overlap corresponding first openings OP1. For example, the second openings OP2 may be formed by forming a second mask pattern on the preliminary second insulating layer 212' (see, e.g., FIG. 4E). The second mask pattern may be used as an etch mask, for example, to etch the preliminary second insulating layer 212'. The formation of the second openings OP2 may be performed, for example, when the first insulating layer 211 is in a cured state and the preliminary second insulating layer 212' is in a non-cured state.

When the second opening OP2 is formed in the preliminary second insulating layer 212', the preliminary second insulating layer 212' may be at least partially removed from inside the first opening OP1. Therefore, the first opening OP1 may be at least partially exposed on its sidewall. In some exemplary embodiments of the present inventive concept, the sidewall of the first opening OP1 may be in a position corresponding to a first sidewall 2113 of the first insulating layer 211. A single etching process may be performed to form the first and second openings OP1 and OP2. The first and second openings OP1 and OP2 may be formed at substantially the same time. Accordingly, a single opening OP may be formed to include the first and second openings OP1 and OP2.

After the preliminary second insulating layer 212' is removed from inside the first opening OP1 and the second opening OP2 is formed in the preliminary second insulating layer 212', the preliminary second insulating layer 212' may be cured. For example, a second insulating layer 212 may be formed h curing the preliminary second insulating layer 212' in which the second opening OP2 is formed. For example, the preliminary second insulating layer 212' may be provided in a chamber. The chamber may have a temperature in a range of from about 150° C. to about 200° C. The preliminary second insulating layer 212' may be cooled to room temperature (e.g., about 25° C.) to obtain the second insulating layer 212, which is cured.

The opening OP may at least partially expose each of the chip pad 110, the first sidewall 2113 of the first insulating layer 211, a portion of the bottom surface 2111 of the first insulating layer 211, and a second sidewall 2123 of the second insulating layer 212.

Figure 4G:
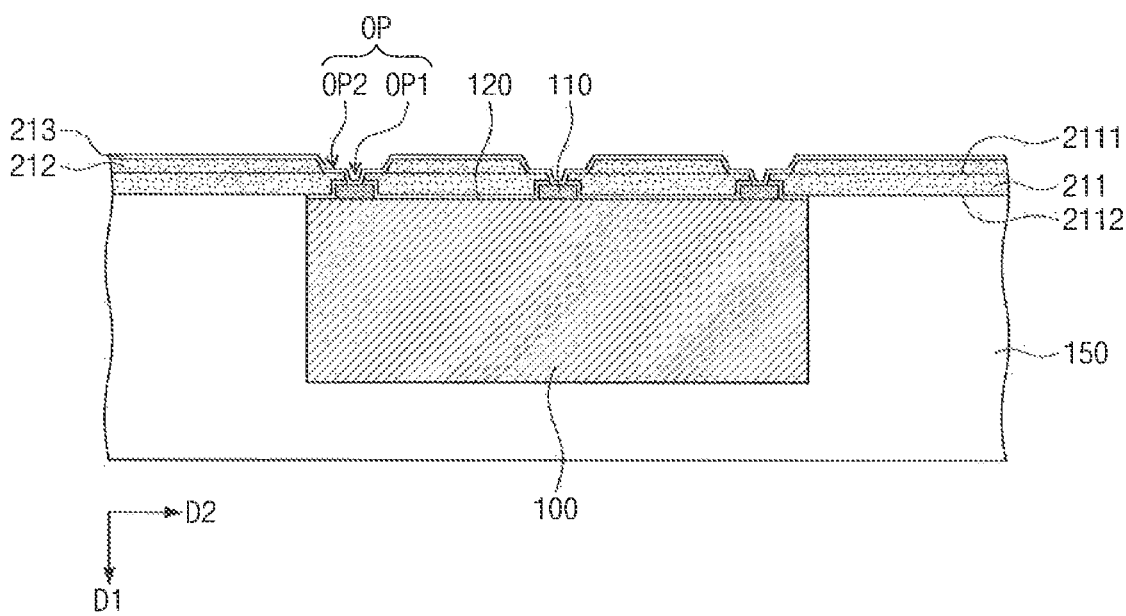

Referring to FIG. 4G, a first barrier metal layer 213 may be formed along sidewalls of each of the first and second openings OP1 and OP2. The sidewall of the second opening OP2 may correspond to the second sidewall 2123 of the second insulating layer 212. For example, the first barrier metal layer 213 may be formed on each of the chip pads 110, portions of the bottom surface 2111 of the first insulating layer 211, the first sidewall 2113 of the first insulating layer 211, and the second sidewall 2123 of the second insulating layer 212, all of which may be at least partially exposed to the first and second openings OP1 and OP2. The first barrier metal layer 213 may also be formed on a bottom surface 2121 of the second insulating layer 212. The first barrier metal layer 213 may be formed, for example, using CVD (Chemical Vapor Deposition), ALD (Atomic Layer Deposition), or PVD (Physical Vapor Deposition), such as sputtering. For example, the first barrier metal layer 213 may be conformally formed on the bottom surface 2121 of the second insulating layer 212.

Figure 4H:
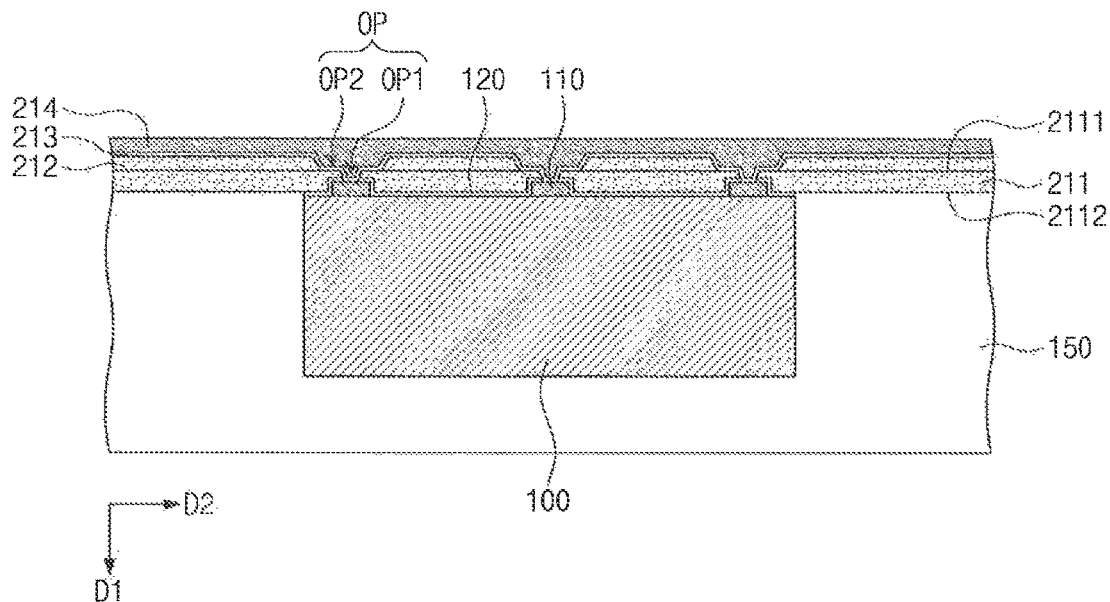

Referring to FIG. 4H, a first redistribution conductive pattern 214 may be formed on the first barrier metal layer 213. For example, an electroplating or electroless plating process may be performed to form the first redistribution conductive pattern 214 on the first barrier metal layer 213. When an electroplating process is performed to form the first redistribution conductive pattern 214 on the first barrier metal layer 213, a seed layer may be formed on a surface of the first barrier metal layer 213. The seed layer may increase uniformity of an electroplating layer. The seed layer may also provide an initial nucleation site. The first redistribution conductive pattern 214 may at least partially cover the first barrier metal layer 213. The first redistribution conductive pattern 214 may at least partially fill each of the first and second openings OP1 and OP2. The first redistribution conductive pattern 214 may be formed on the bottom surface 2121 (see, e.g., FIG. 4F) of the second insulating layer 212. Thus, the first barrier metal layer 213 and the first redistribution conductive pattern 214 may be sequentially formed in the first and second openings OP1 and OP2.

Figure 4I:
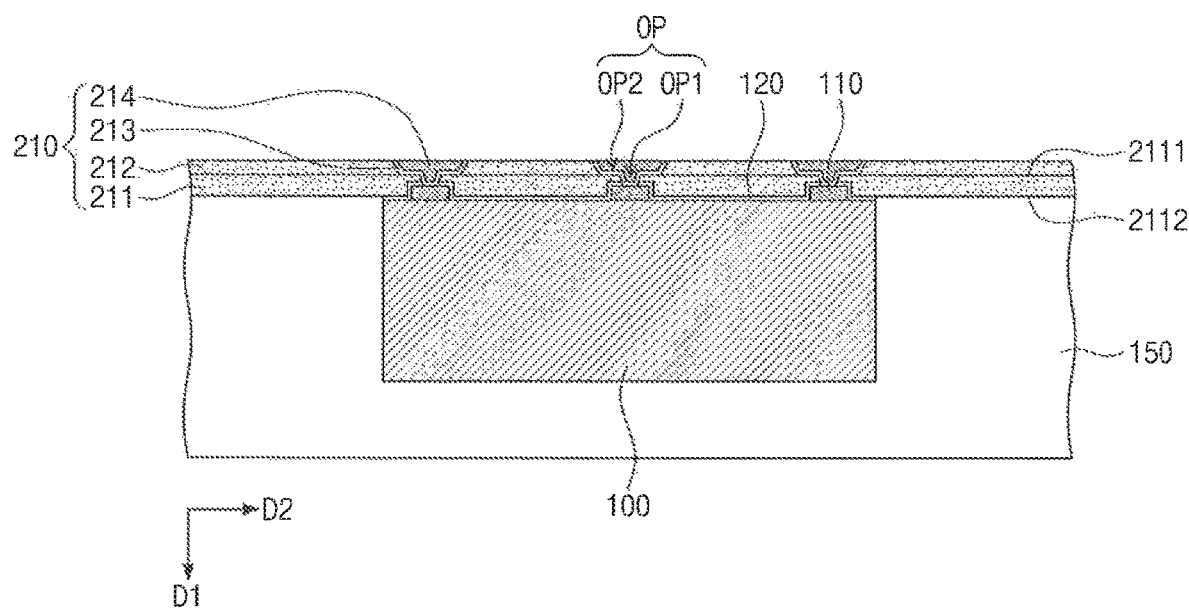

Referring to FIGS. 2B and 4I, a planarization process may be performed to at least partially expose the bottom surface 2121 of the second insulating layer 212. The planarization process may cause the first redistribution conductive pattern 214 to have a bottom surface 2141 at substantially the same level as that of the bottom surface 2121 of the second insulating layer 212. For example, the planarization process may cause the bottom surface 2121 of the second insulating layer 212 to be substantially coplanar with the bottom surface 2141 of the first redistribution conductive pattern 214. The bottom surface 2121 of the second insulating layer 212 may be in a position corresponding to a surface of the second insulating layer 212, and the bottom surface 2141 of the first redistribution conductive pattern 214 may be in a position corresponding to a surface of the first redistribution conductive pattern 214.

In some exemplary embodiments of the present inventive concept, the planarization process may etch the first redistribution conductive pattern 214 and/or the first barrier metal layer 213. For example, the planarization process may include a chemical etching process. The chemical etching process may refer to a planarization technique in which a chemical is used to chemically dissolve and remove the surface of the first redistribution conductive pattern 214 and/or the surface of the first barrier metal layer 213. According to an exemplary embodiment of the present inventive concept, the planarization process may include a surface cutting process. The surface cutting process may refer to a planarization technique in which a blade is used to physically remove the surface of the first redistribution conductive pattern 214 and/or the surface of the first barrier metal layer 213. Referring to FIG. 2B, after the planarization process is performed, the bottom surface 2141 of the first redistribution conductive pattern 214 may have a surface roughness greater than a surface roughness of the bottom surface 2121 of the second insulating layer 212. Through the processes discussed above, a first insulation section 210 may be formed to include the first insulating layer 211, the second insulating layer 212, the first barrier metal layer 213, and the first redistribution conductive pattern 214.

Figure 4J:
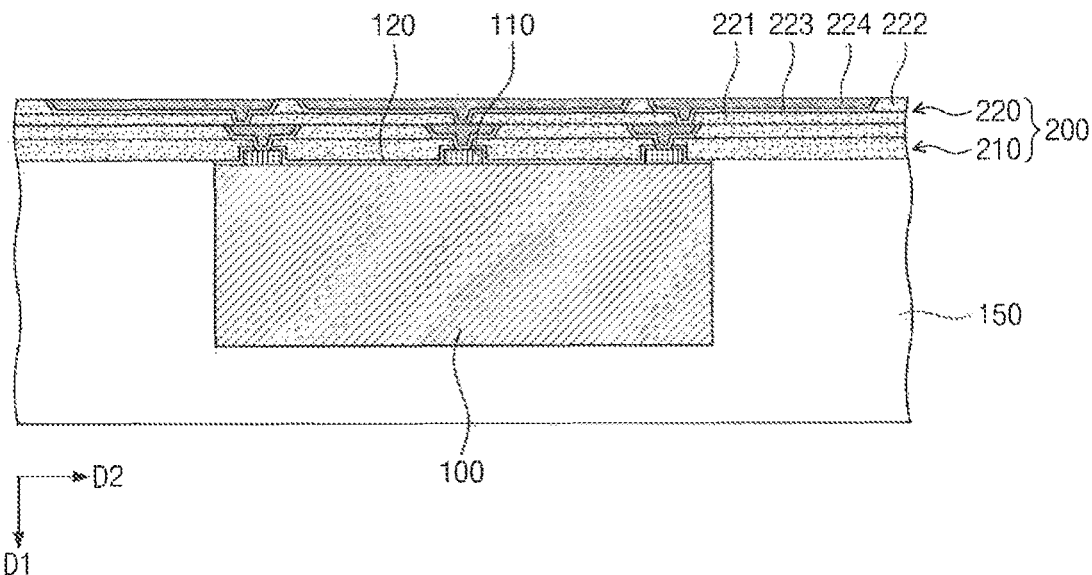

Referring to FIG. 4J, a second insulation section 220 may be formed on the first insulation section 210. The second insulation section 220 may be formed in substantially the same manner as that of the first insulation section 210 discussed above with reference to FIGS. 4C to 4I. The second insulation section 220 may include a third insulating layer 221, a fourth insulating layer 222, a second redistribution conductive pattern 224, and a second barrier metal layer 223. The third insulating layer 221 may be formed on the bottom surface 2141 of the first redistribution conductive pattern 214 and the bottom surface 2121 of the second insulating layer 212. The third insulating layer 221 may be provided. The third insulating layer 221 may include third openings OP3 (see, e.g., FIG. 2). The third openings OP3 may expose at least a portion of the bottom surface 2141 of the first redistribution conductive pattern 214.

Figure 4K:
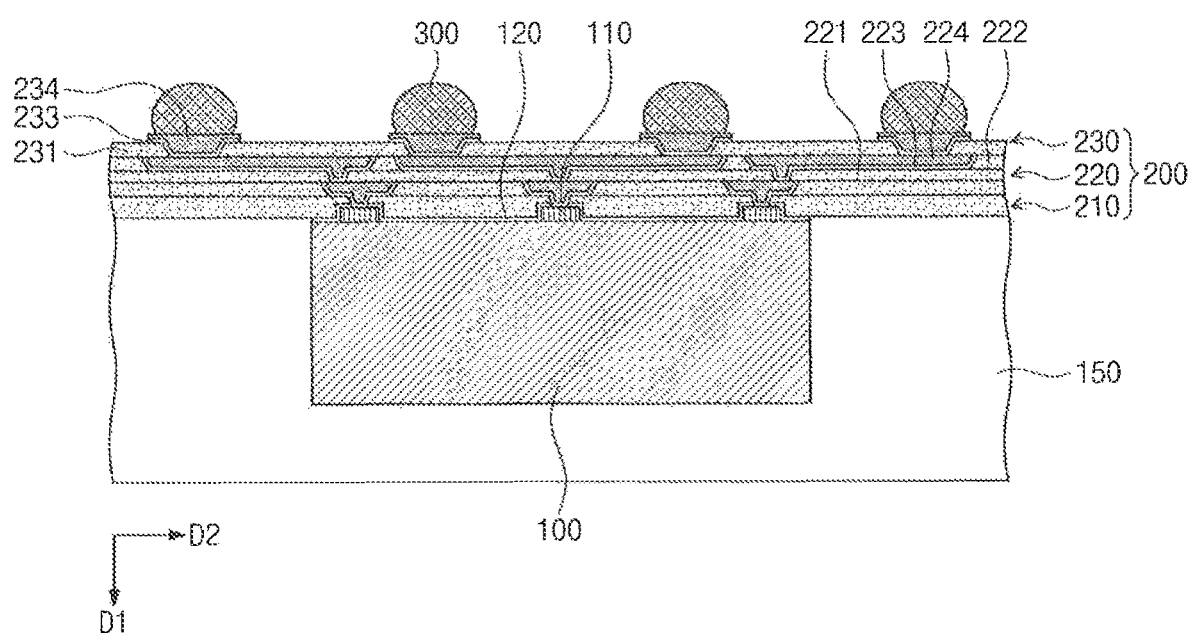

Referring to FIG. 4K, a third insulation section 230 may be formed on the second insulation section 220. The third insulation section 230 may include a fifth insulating layer 231, a third barrier metal layer 233, and a third redistribution conductive pattern 234. In some exemplary embodiments of the present inventive concept, a preliminary fifth insulating layer may be formed on each of the fourth insulating layer 222 and a plurality of the second redistribution conductive patterns 224.

The preliminary fifth insulating layer may be partially etched to form openings. The openings of the preliminary fifth insulating layer may each at least partially expose the second redistribution conductive pattern 224. The preliminary fifth insulating layer may be cured to form the fifth insulating layer 231. The third barrier metal layer 233 may be formed on the fifth insulating layer 231. The third barrier metal layer 233 may extend along a sidewall of the opening. The sidewall of the opening may be in a position corresponding to a sidewall of the fifth insulating layer 231. The third barrier metal layer 233 may be formed on a bottom surface of the fifth insulating layer 231.

After the third barrier metal layer 233 is formed, a third mask pattern may be formed on the third barrier metal layer 233. The third mask pattern may be used, for example, to form the third redistribution conductive pattern 234 on the third barrier metal layer 233. The third redistribution conductive pattern 234 may protrude from the fifth insulating layer 231. The third redistribution conductive patter 234 may also at least partially fill the openings of the fifth insulating layer 231.

The third redistribution conductive pattern 234 may be formed on the third barrier metal layer 233. The third mask pattern may be removed. After the third mask pattern is removed, the third barrier metal layer 233 may be partially removed to have no portion overlapping the third redistribution conductive pattern 234.

After the third barrier metal layer 233 is partially removed to have no portion overlapping the third redistribution conductive pattern 234, external terminals 300 may be formed on a bottom surface of the redistribution substrate 200. For example, the external terminals 300 may be formed on a plurality of the third redistribution conductive patterns 234.

Referring to FIG. 4L, after the external terminals 300 are formed on the bottom surface of the redistribution substrate 200, a singulation process may be performed, for example, to cut each of the molding layer 150 and the redistribution substrate 200. For example, the molding layer 150 and the redistribution substrate 200 may be cut along dotted lines shown in FIG. 4L. Accordingly, the molding layer 150 and the redistribution substrate 200 may be separated into unit semiconductor packages 1.

FIGS. 5A, 5B, 5C, 5D, 5E, 5F, 5G, 5H and 5I are cross-sectional views illustrating a method of manufacturing a semiconductor package according to an exemplary embodiment of the present inventive concept. FIGS. 5A to 5H illustrate a method of manufacturing a unit semiconductor package. Descriptions of components that are substantially the same as those of the exemplary embodiments discussed above with reference to FIGS. 4A to 4K may be omitted below.

Figure 5A:
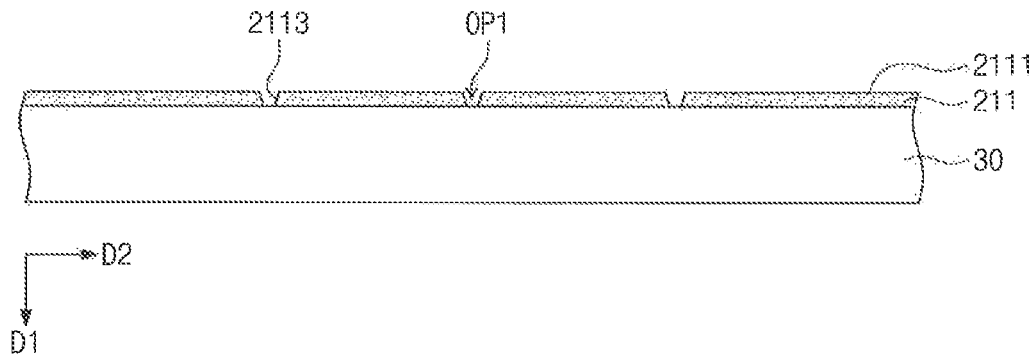

Referring to FIG. 5A, a preliminary first insulating layer 211' may be formed on a carrier substrate 30. First openings OP1 may be formed in the preliminary first insulating layer 211'. The first openings OP1 may at least partially expose the carrier substrate 30.

Figure 5B:
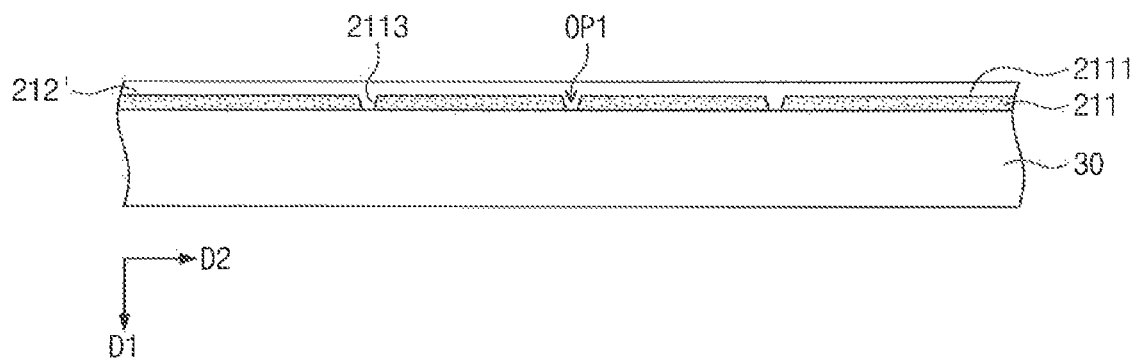

Referring to FIG. 5B, the preliminary first insulating layer 211' (see, e.g. FIG. 5A) may be thermally or optically cured. Thus, the carrier substrate 30 may be provided on the preliminary first insulating layer 211' with a first insulating layer 211 having the first openings OP1 at least partially exposing the carrier substrate 30.

A preliminary second insulating layer 212' may be formed on the first insulating layer 211. The preliminary second insulating layer 212' may at least partially fill the first openings OP1. For example, the preliminary second insulating layer 212' may at least partially cover a bottom surface 2111 of the first insulating layer 211, and may at least partially fill the first openings OP1.

Figure 5C:
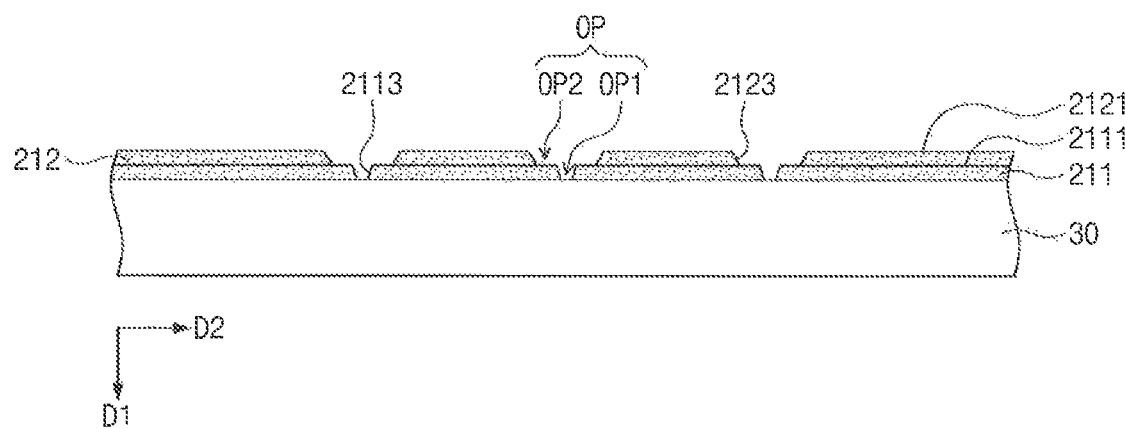

Referring to FIG. 5C, a second opening OP2 may be formed in the preliminary second insulating layer 212' (see, e.g., FIG. 5B). For example, the second opening OP2 may be formed in the preliminary second insulating layer 212'. At substantially the same time, the preliminary second insulating layer 212' may be at least partially removed from inside the first opening OP1. Thus, the bottom surface 2111 of the first insulating layer 211 may be at least partially exposed to the second opening OP2. When the second opening OP2 is formed, a sidewall of the first opening OP1 may be at least partially exposed. The formation of the second opening OP2 may be performed when the first insulating layer 211 is in a cured state and the preliminary second insulating layer 212' is in a non-cured state. After the second opening OP2 is formed, the preliminary second insulating layer 212' may be cured to form a second insulating layer 212. A plurality of second openings OP2 may be formed.

The first and second openings OP1 and OP2 may at least partially expose each of the carrier substrate 30, a first sidewall 2113 of the first insulating layer 211, the bottom surface 2111 of the first insulating layer 211, and a second sidewall 2123 of the second insulating layer 212.

Figure 5D:
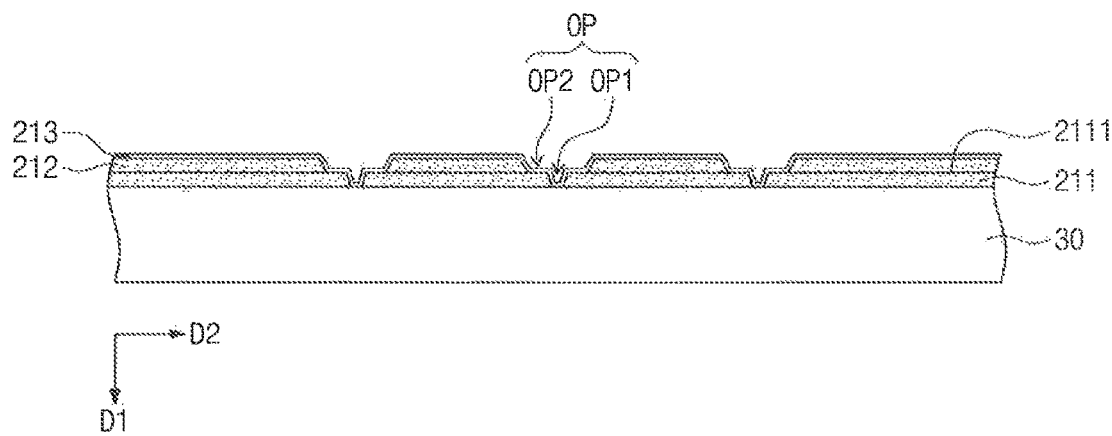

Referring to FIG. 5D, a first barrier metal layer 213 may be formed on the carrier substrate 30, the first sidewall 2113 (see, e.g., FIG. 5C), the bottom surface 2111 of the first insulating layer 211, and the second sidewall 2123 (see, e.g., FIG. 5C), all of which may be at least partially exposed by the first and second openings OP1 and OP2. The first barrier metal layer 213 may also be formed on a bottom surface 2121 (see, e.g., FIG. 5C) of the second insulating layer 212.

Figure 5E:
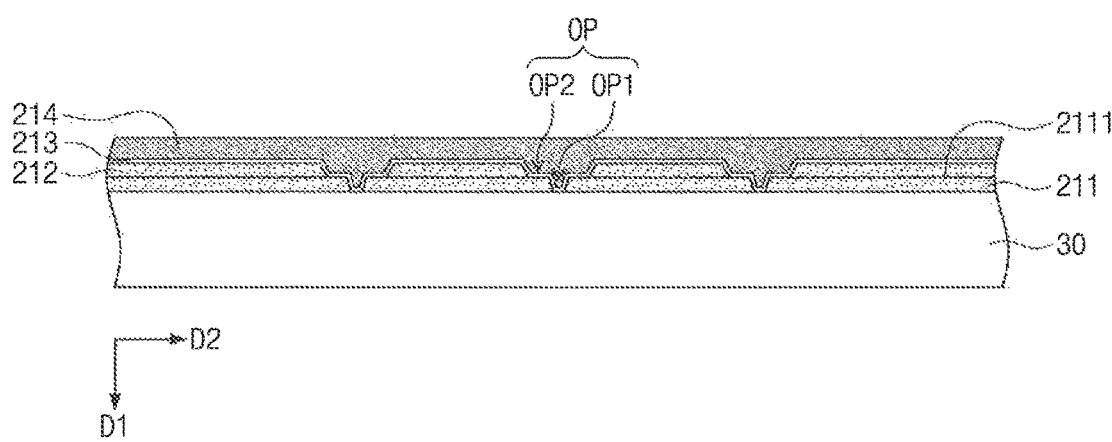

Referring to FIG. 5E, a first redistribution conductive pattern 214 may be formed on the first barrier metal layer 213. The first redistribution conductive pattern 214 may be positioned over the bottom surface 2121 (see, e.g., FIG. 5C) of the second insulating layer 212. The first redistribution conductive pattern 214 may at least partially cover the first barrier metal layer 213, and may at least partially fill the first and second openings OP1 and OP2. Thus, the first barrier metal layer 213 and the first redistribution conductive pattern 214 may be sequentially formed in the first and second openings OP1 and OP2.

Figure 5F:
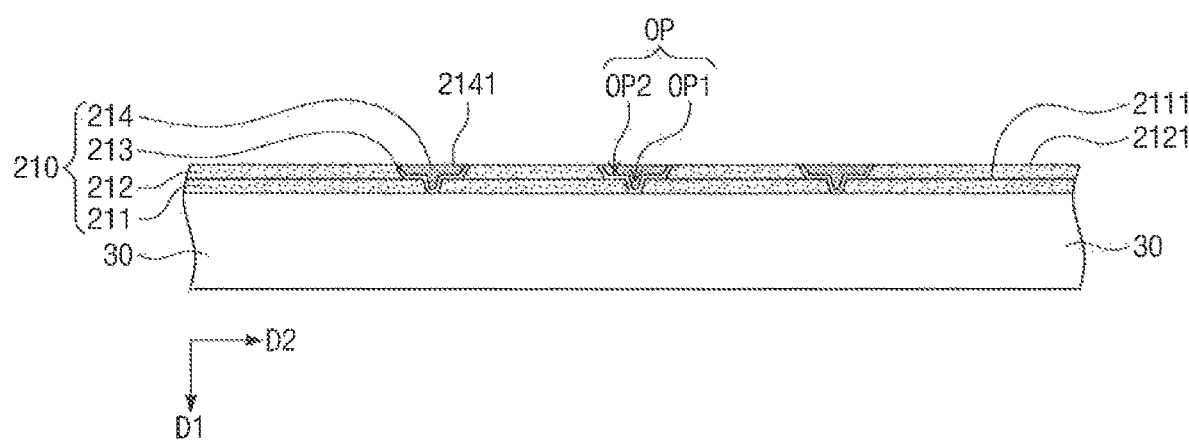

Referring to FIG. 5F, a planarization process may be performed to at least partially expose the bottom surface 2121 of the second insulating layer 212. For example, the planarization process may include a chemical etching process. After the planarization process is performed, the first redistribution conductive pattern 214 may have a bottom surface 2141 having a surface roughness greater than a surface roughness of the bottom surface 2121 of the second insulating layer 212 (see, e.g., FIG. 2B). Thus, a first insulation section 210 may be formed to include the first insulating layer 211, the second insulating layer 212, the first barrier metal layer 213, and the first redistribution conductive pattern 214.

Figure 5G:
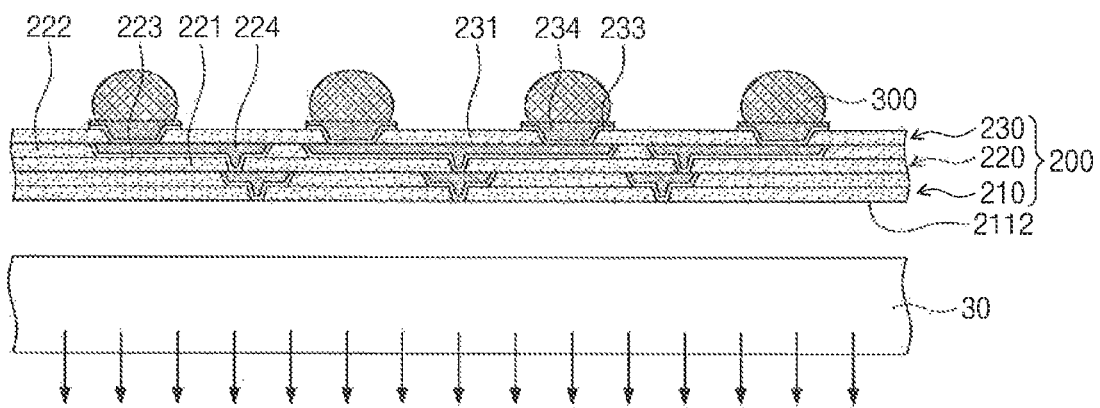

Referring to FIG. 5G, a second insulation section 220 may be formed on the first insulation section 210. The second insulation section 220 may be formed in substantially the same manner as that of the first insulation section 210 discussed above with reference to FIGS. 5A to 5E. Referring to FIG. 4K, a third insulation section 230 may be formed on the second insulation section 220. Accordingly, a redistribution substrate 200 may be formed.

In some exemplary embodiments of the present inventive concept, external terminals 300 may be formed on the redistribution substrate 200. Thereafter, a semiconductor chip 100 may be mounted on the redistribution substrate 200. In some exemplary embodiments of the present inventive concept, the semiconductor chip 100 may be mounted on the redistribution substrate 200. Thereafter, the external terminals 300 may be formed on the redistribution substrate 200.

The external terminals 300 may be formed on a plurality of third redistribution conductive patterns 234. In such a configuration, the external terminals 300 may be electrically connected to each of the first, second, and third redistribution conductive patterns 214, 224, and 234. The carrier substrate 30 may be at least partially removed from the redistribution substrate 200. For example, the carrier substrate 30 may be separated from the first insulating layer 211. Thus, the redistribution substrate 200 may have an at least partially externally exposed top surface (e.g., a top surface 2112 of the first insulation layer 211).

Figure 5H:
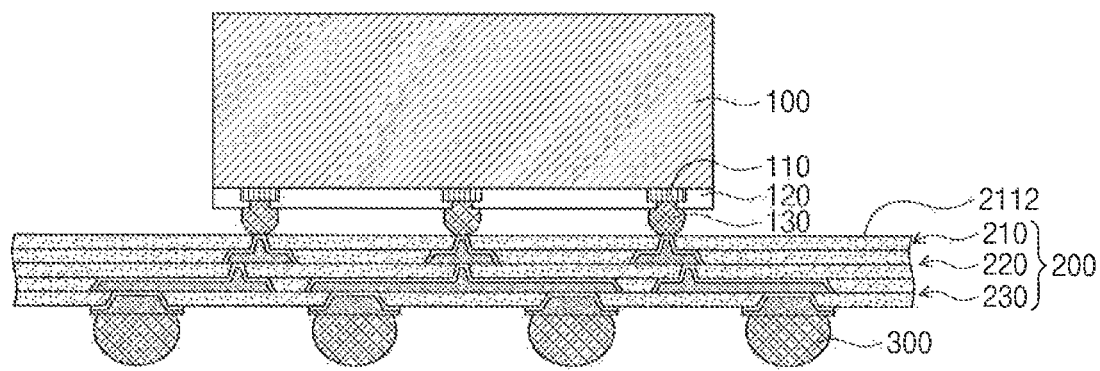

Referring to FIG. 5H, after the carrier substrate 30 is separated from the redistribution substrate 200, the redistribution substrate 200 may be turned upside down (e.g., rotated about 180 degrees). After the redistribution substrate 200 is turned upside down, the semiconductor chip 100 may be provided on the top surface 2112 of the redistribution substrate 200. In this step, chip pads 110 of the semiconductor chip 100 may at least partially vertically overlap a plurality of the first redistribution conductive patterns 214. The chip pads 110 may be electrically connected to the first redistribution conductive patterns 214, for example, through conductive connection members 130. The conductive connection member 130 may be a solder balls, or a solder pillar. In some exemplary embodiments of the present inventive concept, the conductive connection member 130 may be provided on the chip pad 110. A passivation layer 120 may be provided on a bottom surface of the semiconductor chip 100. The passivation layer 120 may have openings. The openings of the passivation layer 120 may at least partially expose the chip pads 110. The conductive connection members 130 may be electrically connected to the chip pads 110, for example, through the openings of the passivation layer 120.

Referring to FIG. 5I, the molding layer 150 may be formed on the top surface 2112 of the redistribution substrate 200 including a plurality of the semiconductor chips 100 on the top surface 2112. The molding layer 150 may at least partially cover the semiconductor chips 100 and the top surface 2112 of the redistribution substrate 200. After the molding layer 150 is formed, a singulation process may be performed such that the molding layer 150 and the redistribution substrate 200 may be cut along dotted lines shown in FIG. 5I. Thus, the molding layer 150 and the redistribution substrate 200 may be separated into unit semiconductor packages 1.

According to some exemplary embodiments of the present inventive concept, the barrier metal layer may be formed on the side surface of the redistribution conductive pattern, which may increase a lifetime of the semiconductor package. The redistribution conductive pattern may have a surface in direct contact with the insulating layer, which may have a greater surface roughness, which may increase an adhesive force between the redistribution conductive pattern and the insulating layer.

Exemplary embodiments of the present inventive concept are not limited to the description set forth herein, other effects which have not been mentioned above will be clearly understood to those skilled in the art.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:

1. A method of fabricating a semiconductor package, the method comprising:
    forming a preliminary first insulating layer including a first opening;
    curing the preliminary first insulating layer to form a first insulating layer;
    forming a preliminary second insulating layer on the first insulating layer, the preliminary second insulating layer at least partially filling the first opening;
    forming a second opening in the preliminary second insulating layer, the second opening at least partially overlapping the first opening, wherein a sidewall of the first opening is at least partially exposed during forming the second opening;
    curing the preliminary second insulating layer to form a second insulating layer;
    forming a barrier metal layer along the sidewall of the first opening and along a sidewall of the second opening;
    forming a redistribution conductive pattern on the barrier metal layer; and
    performing a planarization process to at least partially expose the second insulating layer,
    wherein, after performing the planarization process, the redistribution conductive pattern has a surface roughness greater than a surface roughness of the second insulating layer.

2. The method of claim 1, wherein, after performing the planarization process, the redistribution conductive pattern has a surface roughness of greater amplitude and period than a surface roughness of the second insulating layer.

3. The method of claim 1, wherein the planarization process comprises a chemical etching process.

4. The method of claim 1, wherein the second opening has a width greater than a width of the first opening.

5. The method of claim 1, wherein the planarization process causes the redistribution conductive pattern to have a surface that is substantially coplanar with a surface of the second insulating layer.

6. The method of claim 1, further comprising forming a third insulating layer on each of the redistribution conductive pattern and the second insulating layer,
    wherein the third insulating layer includes a third opening that at least partially exposes the redistribution conductive pattern.

7. The method of claim 1, wherein
    the second opening at least partially exposes a sidewall of the second insulating layer, and
    the barrier metal layer is formed between the redistribution conductive pattern and the sidewall of the second insulating layer.

8. The method of claim 1, wherein the first and second insulating layers each comprise one or more of photosensitive polyimide (PSPI), polybenzoxazole (PBO), phenolic polymer, or benzocyclobutene polymer (BCB).

9. A method of manufacturing a semiconductor package, the method comprising:
    forming on a semiconductor chip a first insulating layer including a first opening, the first opening at least partially exposing the semiconductor chip;
    forming a second insulating layer on the first insulating layer, the second insulating layer at least partially filling the first opening;
    forming in the second insulating layer a second opening, the second opening at least partially overlapping the first opening, wherein a sidewall of the first opening is at least partially exposed during forming the second opening;
    sequentially forming a barrier metal layer and a redistribution conductive pattern in the first and second openings; and
    performing a planarization process to at least partially expose the second insulating layer,
    wherein forming the second opening is performed under a condition that the first insulating layer is in a cured state and the second insulating layer is in a non-cured state, and
    wherein, after performing the planarization process, the redistribution conductive pattern has a surface roughness greater than a surface roughness of the second insulating layer.

10. The method of claim 9, wherein, after performing the planarization process, the redistribution conductive pattern has a surface roughness of greater amplitude and period than a surface roughness of the second insulating layer.

11. The method of claim 9, further comprising, after forming the second opening, at least partially curing the non-cured second insulating layer.

12. The method of claim 9, wherein the planarization process provides the redistribution conductive pattern to have a surface at substantially a same level as a surface of the at least partially exposed second insulating layer.

13. The method of claim 9, wherein, the first opening is positioned in the second opening in a plan view.

14. The method of claim 9, wherein the first and second insulating layers comprise one or more of photosensitive polyimide (PSPI), polybenzoxazole (PBO), phenolic polymer, or benzocyclobutene polymer (BCB).

15. The method of claim 9, wherein
    the semiconductor chip comprises a chip pad, and
    the redistribution conductive pattern is electrically connected to the chip pad.

16. A method of manufacturing a semiconductor package, the method comprising:
    providing a support substrate;
    placing a semiconductor chip on the support substrate;

forming a molding layer on the support substrate, the molding layer at least partially covering the semiconductor chip;

removing the support substrate to at least partially expose a bottom surface of the semiconductor chip and a bottom surface of the molding layer;

forming on the semiconductor chip a first insulating layer including a first opening, the first opening at least partially exposing the semiconductor chip, wherein the first insulating layer is formed on the bottom surface of the semiconductor chip and the bottom surface of the molding layer;

forming a second insulating layer on the first insulating layer, the second insulating layer at least partially filling the first opening;

forming in the second insulating layer a second opening, the second opening at least partially overlapping the first opening, wherein a sidewall of the first opening is at least partially exposed during forming the second opening, wherein forming the second opening is performed under a condition that the first insulating layer is in a cured state and the second insulating layer is in a non-cured state;

sequentially forming a barrier metal layer and a redistribution conductive pattern in the first and second openings; and performing a planarization process to at least partially expose the second insulating layer.

17. The method of claim 16, further comprising forming an external terminal electrically connected to the redistribution conductive pattern, wherein the external terminal at least partially overlaps the molding layer in a plan view.

18. A method of fabricating a semiconductor package, the method comprising:

forming a redistribution substrate; and providing a semiconductor chip on the redistribution substrate, the semiconductor package electrically connecting the semiconductor chip to the redistribution substrate, wherein forming the redistribution substrate comprises:

forming a first insulating layer on a carrier substrate, the first insulating layer including a first opening exposing at least a portion of the carrier substrate;

forming a second insulating layer on the first insulating layer, the second insulating layer at least partially filling the first opening;

forming a second opening in the second insulating layer, wherein a sidewall of the first opening is at least partially exposed during forming the second opening;

sequentially forming a barrier metal layer and a redistribution conductive pattern in the first and second openings; and performing a planarization process to at least partially expose the second insulating layer, wherein forming the second opening is performed under a condition that the first insulating layer is in a cured state and the second insulating layer is in a non-cured state, and wherein, after performing the planarization process, the redistribution conductive pattern has a surface roughness greater than a surface roughness of the second insulating layer.

19. The method of claim 18, wherein, after performing the planarization process, the redistribution conductive pattern has a surface roughness of greater amplitude and period than a surface roughness of the second insulating layer.

20. The method of claim 18, further comprising, after forming the second opening, at least partially curing the non-cured second insulating layer.

* * * * *